US010128150B2

(12) United States Patent
Manna et al.

(10) Patent No.: US 10,128,150 B2
(45) Date of Patent: Nov. 13, 2018

(54) PROCESS OF FILLING THE HIGH ASPECT RATIO TRENCHES BY CO-FLOWING LIGANDS DURING THERMAL CVD (71) Applicant: Applied Materials, Inc., Santa Clara, CA (US)

(72) Inventors: Pramit Manna, Sunnyvale, CA (US); Rui Cheng, Santa Clara, CA (US); Kelvin Chan, San Ramon, CA (US); Abhijit Basu Mallick, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 27 days.

(21) Appl. No.: 15/083,590

(22) Filed: Mar. 29, 2016

(65) Prior Publication Data

US 2016/0293483 A1 Oct. 6, 2016

Related U.S. Application Data (60) Provisional application No. 62/142,571, filed on Apr. 3, 2015.

(51) Int. Cl.
*C23C 16/00* (2006.01)
*H01L 21/768* (2006.01)
(Continued)

(52) U.S. Cl.
CPC ...... *H01L 21/76846* (2013.01); *C23C 16/045* (2013.01); *C23C 16/16* (2013.01);
(Continued)

(58) Field of Classification Search
CPC .......... C23C 16/00; C23C 16/22; C23C 16/30
See application file for complete search history.

(56) References Cited

U.S. PATENT DOCUMENTS 3,375,274 A 3/1968 Faust et al.
6,967,405 B1 * 11/2005 Yu .................... H01L 21/76829
257/751
(Continued)

OTHER PUBLICATIONS

"Ligand". Encyclopædia Britannica. Encyclopædia Britannica Online. Encyclopædia Britannica Inc., 2017. Web. Sep. 19, 2017 <https://www.britannica.com/science/ligand>.*
(Continued)

*Primary Examiner* — Kelly M Gambetta
(74) *Attorney, Agent, or Firm* — Patterson + Sheridan LLP (57) ABSTRACT Implementations of the present disclosure generally relate to methods for forming thin films in high aspect ratio feature definitions. In one implementation, a method of processing a substrate in a process chamber is provided. The method comprises flowing a boron-containing precursor comprising a ligand into an interior processing volume of a process chamber, flowing a nitrogen-containing precursor comprising the ligand into the interior processing volume and thermally decomposing the boron-containing precursor and the nitrogen-containing precursor in the interior processing volume to deposit a boron nitride layer over at least one or more sidewalls and a bottom surface of a high aspect ratio feature definition formed in and below a surface of a dielectric layer on the substrate.

20 Claims, 4 Drawing Sheets (51) Int. Cl.
*H01L 21/285* (2006.01)
*C23C 16/04* (2006.01)
*C23C 16/16* (2006.01)
*C23C 16/34* (2006.01)
*C23C 16/46* (2006.01)

(52) U.S. Cl.
CPC .......... *C23C 16/342* (2013.01); *C23C 16/46* (2013.01); *H01L 21/28556* (2013.01); *H01L 21/76864* (2013.01); *H01L 21/76877* (2013.01)

(56) References Cited

U.S. PATENT DOCUMENTS

| | | |
|---|---|---|
| 2006/0128150 A1 | 6/2006 | Gandikota et al. |
| 2006/0224008 A1 | 10/2006 | Suzuki et al. |
| 2008/0044573 A1 | 2/2008 | Chen et al. |
| 2008/0292798 A1 | 11/2008 | Huh et al. |
| 2009/0263972 A1 | 10/2009 | Balseanu et al. |
| 2009/0286402 A1* | 11/2009 | Xia ............ H01L 21/0337 438/703 |
| 2010/0098884 A1 | 4/2010 | Balseanu et al. |
| 2010/0099236 A1* | 4/2010 | Kwon ........... H01L 21/02112 438/435 |
| 2012/0231626 A1 | 9/2012 | Lee et al. |
| 2014/0166983 A1* | 6/2014 | Cohen ............ H01L 29/66484 257/29 |
| 2014/0213059 A1 | 7/2014 | Doan et al. |

OTHER PUBLICATIONS

International Search Report and Written Opinion for International Application No. PCT/US2016/024723 dated Jun. 27, 2016.

* cited by examiner

PROCESS OF FILLING THE HIGH ASPECT RATIO TRENCHES BY CO-FLOWING LIGANDS DURING THERMAL CVD

CROSS-REFERENCE TO RELATED APPLICATIONS

This application claims benefit of U.S. provisional patent application Ser. No. 62/142,571, filed Apr. 3, 2015. The aforementioned related patent application is herein incorporated by reference in its entirety.

FIELD

Implementations of the present disclosure generally relate to methods for forming thin films in high aspect ratio feature definitions.

BACKGROUND

Many deposition processes have difficulty filling the small trenches and other gap features used in current semiconductor processing schemes. Individual trenches and other gap type features produced in any given technology node have principal dimensions that are significantly smaller than the critical dimensions that define the current technology. Thus, it is not unusual to find gaps on the order of 100 nm or less. In future years, feature sizes will shrink to even smaller dimensions. Unless the processes are extremely conformal, the gaps pinch off at their necks. Compounding the problem is the fact that many gaps have relatively high aspect ratios, for example, at least 5:1. Examples of situations where one can find high aspect ratio dimensions and geometries include damascene copper line processes, shallow trench isolation, and interlayer dielectric (ILD) applications.

Filling such trenches in a reliable manner, while avoiding voids in the fill material is particularly challenging at this scale. Current processes including Physical Vapor Deposition (PVD) and Plasma Enhanced Chemical Vapor Deposition (PECVD), including High Density Plasma Chemical Vapor Deposition (HDP CVD), each of which presents some issues for filling small dimension, high aspect ratio features. Conformal deposition techniques may be inappropriate for situations where the dimension of the neck is narrower than the rest of the feature. This is because the conformal nature of the deposition leads to "pinching off", where the reentrant features are not completely filled before the entrance to the feature is sealed off. In addition, conformal deposition often leads to weak spots or seams in structures with vertical walls.

Therefore, improved deposition techniques for creating void free fill in high aspect ratio dimensioned features are needed.

SUMMARY

Implementations of the present disclosure generally relate to methods for forming thin films in high aspect ratio feature definitions. In one implementation, a method of processing a substrate in a process chamber is provided. The method comprises flowing a boron-containing precursor comprising a ligand into an interior processing volume of a process chamber, flowing a nitrogen-containing precursor comprising the ligand into the interior processing volume, and thermally decomposing the boron-containing precursor and the nitrogen-containing precursor in the interior processing volume to deposit a boron nitride layer over at least one or more sidewalls and a bottom surface of a high aspect ratio feature definition formed in and below a surface of a dielectric layer on the substrate.

In another implementation, a method of processing a substrate in a process chamber is provided. The method comprises flowing a metal organic containing precursor gas comprising a ligand into an interior processing volume of a process chamber, flowing a precursor gas comprising the ligand into the processing volume and thermally decomposing the metal-containing precursor gas comprising the ligand and the precursor gas comprising the ligand in the interior processing volume to deposit a metal-containing layer over at least one or more sidewalls and a bottom surface of a feature definition in and below a surface of a dielectric layer on the substrate.

In yet another implementation, a method of processing a substrate in a process chamber is provided. The method comprises flowing a source-containing precursor gas comprising a ligand into an interior processing volume of a process chamber, flowing an additional ligand-containing precursor gas comprising the ligand into the interior processing volume, and thermally decomposing the source-containing precursor gas and the ligand-containing precursor gas in the interior processing volume to deposit a layer material over at least one or more sidewalls and a bottom surface of a high aspect ratio feature definition formed in and below a surface of a dielectric layer on the substrate.

BRIEF DESCRIPTION OF THE DRAWINGS

So that the manner in which the above-recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements disclosed in one implementation may be beneficially used on other implementations without specific recitation.

DETAILED DESCRIPTION

The following disclosure describes processes for the deposition of thin films and devices for carrying out the aforementioned processes. Certain details are set forth in the following description and in FIGS. 1-4 to provide a thorough understanding of various implementations of the disclosure. Other details describing well-known methods and systems often associated with the deposition of thin films are not set forth in the following disclosure to avoid unnecessarily obscuring the description of the various implementations.

Many of the details, components and other features described herein are merely illustrative of particular implementations. Accordingly, other implementations can have other details, components, and features without departing from the spirit or scope of the present disclosure. In addition, further implementations of the disclosure can be practiced without several of the details described below.

Development of thin film materials which can fill high aspect ratio features remains an elusive goal. Thin films deposited by plasma CVD typically demonstrate poor conformality, which leads to void formation inside the high aspect ratio feature. Thin films deposited by thermal CVD typically demonstrate conformality higher than 90%. However, current methods of filling high aspect ratio features using thermal CVD typically result in seam formation.

Implementations of the present disclosure improve the conformality and gap-fill capability of thin films deposited in high aspect ratio features in comparison to thin films deposited using currently know plasma CVD techniques. Implementations described herein include co-flowing a single source precursor comprising a ligand with an additional precursor comprising the ligand using a thermal CVD process. For example, conformal boron-containing films can be deposited using thermal CVD with precursors such as dimethylamine borane, borazine and alkyl borazines. The deposition temperature can vary from 300 degrees Celsius to 800 degrees Celsius (e.g., 300 degrees Celsius to 550 degrees Celsius). The conformality of boron-containing films can be further improved by co-flowing nitrogen containing ligands such as ammonia, dimethylamine, and trimethylamine along with the boron-containing precursor. Not to be bound by theory but it is believed that co-flowing the additional precursor comprising the ligand reduces the rate of decomposition of the source precursor resulting in improved conformality. Furthermore, by selecting the proper source precursor to ligand flow ratio, it is possible to reduce the growth of the film at the top of high aspect ratio feature resulting in bottom up gap-fill. The implementations described herein are also applicable to metal deposition. For, example, metallic tungsten can be deposited by thermal decomposition of tungsten hexacarbonyl ($W(CO)_6$). However, the tungsten film deposited using the single source tungsten hexacarbonyl precursor also suffers from poor conformality. It has been found that the addition of carbon monoxide to the process improves the conformality and gap-fill capability of the deposited tungsten film.

Exemplary applications include "front-end of line" applications, such as spacer layers and strain-inducing layers used to control stress of an underlying film and "back-end of line" applications, such as barrier materials and interconnect formation.

Figure 1:
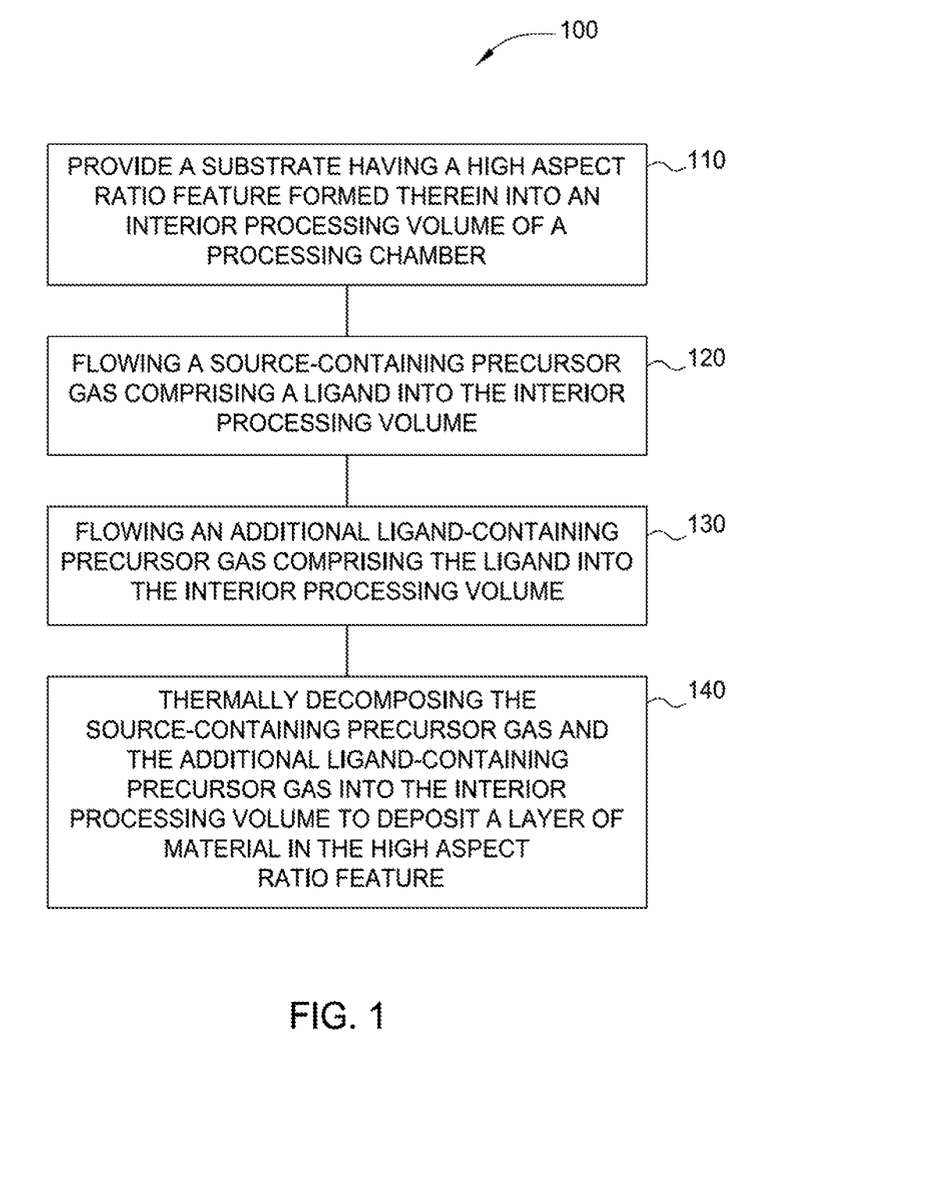
FIG. 1 is a flowchart illustrating an overview of a simplified film deposition method according to implementations described herein.
Figure 4:
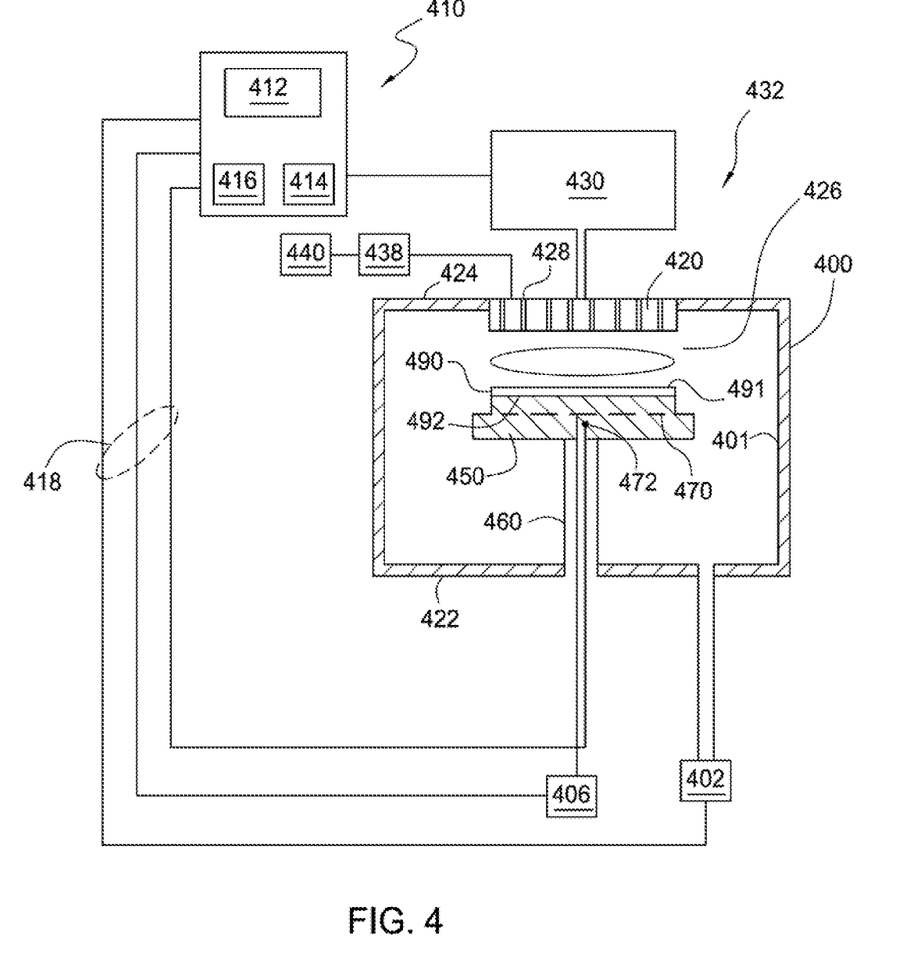
FIG. 4 is a schematic illustration of an apparatus that can be used for the practice of implementations described herein.

FIG. 1 is a flowchart illustrating an overview of a film deposition method 100 according to implementations described herein. At process 110 of the method 100, a substrate having a high aspect ratio feature formed therein is positioned in an interior processing volume of a process chamber. One exemplary process chamber 400 is depicted in FIG. 4. In one implementation, the substrate is a semiconductor wafer (e.g., silicon wafer having a diameter of about 300 mm or less; a silicon wafer with a diameter of about 100 mm, 150 mm, 200 mm, 300 mm, 400 mm, etc.) and may include structures, device components, etc., formed in earlier processes. For example, the substrate may include features with high height to width aspect ratios (the ratio of the height of the bare hole divided by the width of the hole) of at least about 5:1 or more (e.g., an aspect ratio of 6:1 or more, 7:1 or more, 8:1 or more, 9:1 or more, 10:1 or more, 11:1 or more, 12:1, or even about 10:1 to about 15:1). Exemplary feature definitions include vias, trenches, lines, contact holes, through-holes or other feature definitions utilized in a semiconductor, solar, or other electronic devices, such as high ratio contact plugs.

At process 120, a source-containing precursor gas comprising a ligand is flowed into the interior processing volume of the process chamber. In one implementation, the source-containing precursor gas is introduced into the interior processing volume of the process chamber at a flow rate between about 5 sccm and about 50,000 sccm (e.g., between about 1,000 sccm and about 10,000 sccm; between about 2,000 sccm and about 7,000 sccm) for a 300 mm substrate. In one implementation, the source-containing precursor gas is introduced into the interior processing volume with a dilution gas. Exemplary dilution gases include nitrogen ($N_2$), hydrogen ($H_2$), argon (Ar), or a combination thereof. Dependent upon the source-containing precursor gas used, the dilution gas may be introduced into the interior processing volume at a flow rate between about 5 sccm and about 50,000 sccm (e.g., between about 1,000 sccm and about 10,000 sccm; between about 2,000 sccm and about 7,000 sccm) for a 300 mm substrate.

At process 130, an additional ligand-containing precursor gas comprising the ligand is flowed into the interior processing volume of the process chamber. The ligand in the additional ligand-containing precursor gas is selected to match or substantially match the ligand present in the source-containing precursor gas. Dependent upon the additional ligand-containing precursor gas used, the additional ligand-containing precursor may be introduced into the interior processing volume of the process chamber at a flow rate between about 5 sccm and about 50,000 sccm (e.g., between about 1,000 sccm and about 10,000 sccm; between about 2,000 sccm and about 7,000 sccm) for a 300 mm substrate. In one implementation, the additional ligand-containing precursor gas is introduced into the interior processing volume of the process chamber with a dilution gas. Other gases may be used as well including gases comprising silicon-containing compounds, carbon-containing compounds, and phosphorous-containing compounds among others. In one implementation, at least one of the gases comprising silicon-containing compounds, carbon-containing compounds, and phosphorous-containing compounds are present while the source-containing precursor gas and the additional ligand-containing precursor gas are in the chamber (not shown in FIG. 1). Alternatively, at least one of the gases comprising silicon-containing compounds, carbon-containing compounds, and phosphorous-containing compounds is introduced into the chamber before or after the introduction of the source-containing precursor gas and the additional ligand-containing precursor gas.

In some implementations, the source-containing precursor gas comprising a ligand and the additional ligand-containing precursor gas may be flowed into the interior processing volume simultaneously via separate gas inlets and mixed in the interior processing volume of the process chamber prior to thermal decomposition. In some implementations, the source-containing precursor gas comprising a ligand and the additional ligand-containing precursor gas may be mixed prior to flowing into the interior processing volume of the process chamber. The gas mixture may be introduced into the interior processing volume at a flow rate between about 5 sccm and about 50,000 sccm (e.g., between about 10 sccm and about 1,000 sccm; between about 100 sccm and about 500 sccm) for a 300 mm substrate.

At process 140, the source-containing precursor gas and the additional ligand-containing precursor gas are thermally decomposed in the interior processing volume to deposit a layer of material in the high aspect ratio feature. The thermal decomposition process is performed in the absence of plasma. For deposition of the layer of material, the temperature of a substrate support in the chamber may be set to between about 100 degrees Celsius and about 1,000 degrees Celsius, e.g., between about 300 degrees Celsius and about 550 degrees Celsius, and the pressure in the chamber may be between about 10 mTorr and about 760 Torr, e.g., between about 2 Torr and about 10 Torr, during the thermal deposition process. The as-deposited material may have a thickness between about 2 Å and about 5,000 Å.

The as-deposited material layer may be exposed to a variety of post-deposition treatment processes.

Figure 2:
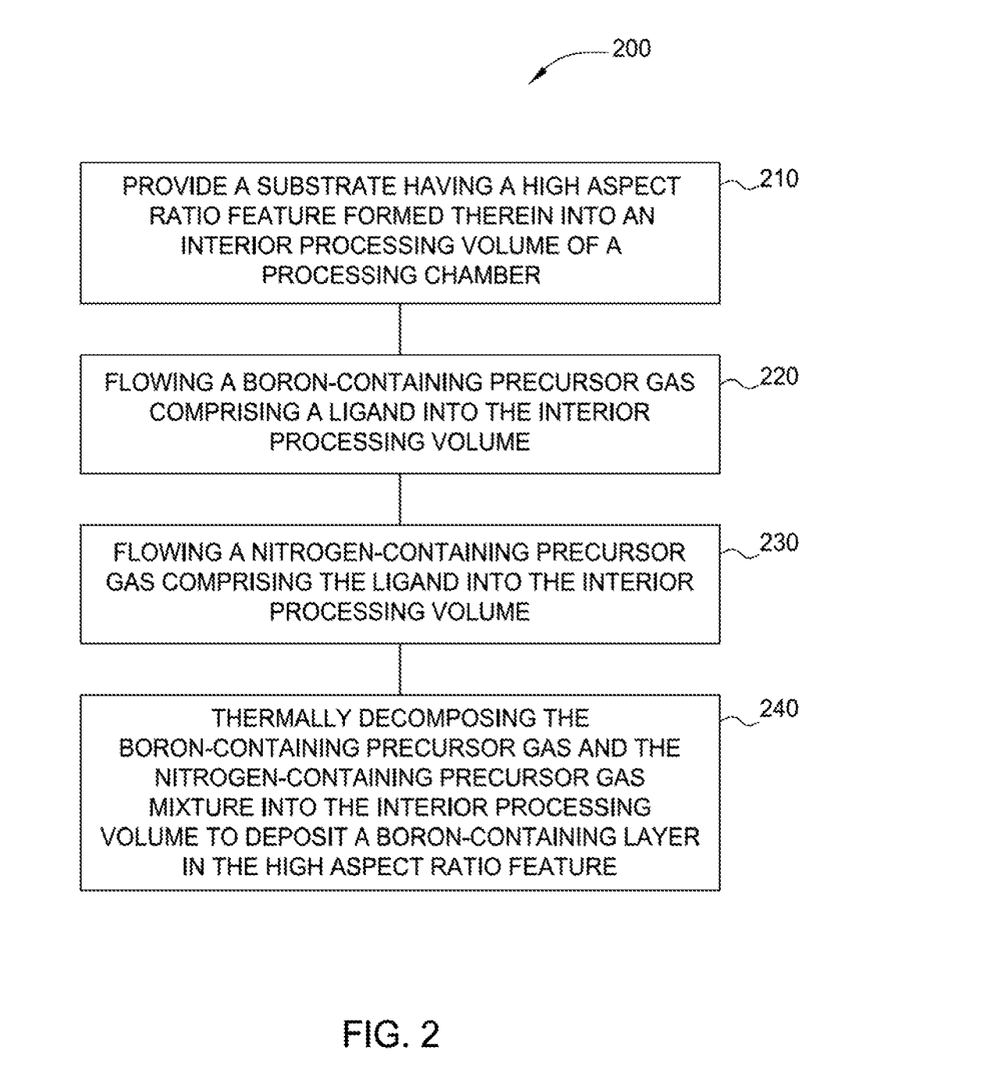
FIG. 2 is a flowchart illustrating an overview of a simplified boron-containing film deposition method according to implementations described herein.

FIG. 2 is a flowchart illustrating an overview of a boron-containing film deposition method 200 according to implementations described herein. At process 210 of the method 200, a substrate having a high aspect ratio feature formed therein is positioned in an interior processing volume of a process chamber similar to process 110.

At process 220, a boron-containing precursor gas comprising a ligand is flowed into the interior processing volume of the process chamber. In process 220, the boron-containing precursor may include boranes, borazine ($B_3N_3H_6$), or an alkyl-substituted derivative of borazine. Exemplary boranes include ammonia borane, dimethylamine borane (DMAB) and trimethylamine borane (TMAB). Exemplary boron-containing precursors may be selected from the group consisting of:

and combinations thereof, wherein R is independently selected from the group of: H and lower alkyl groups of 1 to 5 carbon atoms.

Examples of suitable alkyl groups of 1 to 5 carbon atoms include methyl, ethyl, propyl, isopropyl, butyl, isobutyl, tert-butyl and neopentyl.

In one implementation, the boron-containing precursor is selected from the group consisting of borazine, dimethylamine borane, triethylamine borane, triethlamine borane, alkyl borazines, and combinations thereof, wherein the alkyl is a lower alkyl group containing from 1 to 5 carbon atoms.

The boron-containing precursor may be introduced into the chamber at a flow rate between about 5 sccm and about 50,000 sccm (e.g., between about 10 sccm and about 1,000 sccm; between about 100 sccm and about 500 sccm) for a 300 mm substrate. The boron-containing precursor gas may be introduced into the interior processing volume with a dilution gas. Exemplary dilution gases include nitrogen ($N_2$), hydrogen ($H_2$), argon (Ar), or a combination thereof. Dependent upon the boron-containing precursor gas used, the dilution gas may be introduced into the interior processing volume at a flow rate between about 5 sccm and about 50,000 sccm (e.g., between about 1,000 sccm and about 10,000 sccm; between about 2,000 sccm and about 7,000 sccm) for a 300 mm substrate.

At process 230, a nitrogen-containing precursor gas comprising the ligand is flowed into the interior processing volume of the process chamber. The nitrogen-containing precursor gases containing the ligand may be selected from the group consisting of: $NH_3$, $H_2NR$, $HNR_2$, $NR_3$, and combinations thereof, wherein R is a lower alkyl group of 1 to 5 carbon atoms. Suitable nitrogen-containing precursor gases include one or more of the following compounds methylamine, dimethylamine, trimethylamine (TMA), diethylamine, triethylamine, and combinations thereof.

The nitrogen-containing precursor gas is selected such that the ligand of the nitrogen-containing precursor matches with or substantially matches with the ligand present in the boron-containing precursor. For example, dimethylamine is used with dimethylamine borane and trimethylamine is used with trimethylamine borane.

Dependent upon the nitrogen-containing precursor gas used, the nitrogen-containing precursor gas may be introduced into the interior processing volume of the process chamber at a flow rate between about 5 sccm and about 50,000 sccm (e.g., between about 1,000 sccm and about 10,000 sccm; between about 2,000 sccm and about 7,000 sccm) for a 300 mm substrate. The nitrogen-containing precursor gas may be introduced into the interior processing volume of the process chamber with a dilution gas. Other gases may be used as well including gases comprising silicon-containing compounds, carbon-containing compounds, and phosphorous-containing compounds among others. In one implementation, at least one of the gases comprising silicon-containing compounds, carbon-containing compounds, and phosphorous-containing compounds are present while the boron-containing precursor is in the chamber (not shown in FIG. 2). Alternatively, at least one of the gases comprising silicon-containing compounds, carbon-containing compounds, and phosphorous-containing compounds is introduced into the chamber before or after the introduction of the boron-containing precursor.

At process 240, the boron-containing precursor gas and the nitrogen-containing precursor gas are thermally decomposed to deposit a boron-containing layer in the high aspect ratio feature. For deposition of the boron-containing film in the absence of a plasma in the chamber, the temperature of a substrate support in the chamber may be set to between about 100 degrees Celsius and about 1,000 degrees Celsius (e.g., between about 200 degrees Celsius and about 800 degrees Celsius; between about 300 degrees Celsius and about 550 degrees Celsius), and the pressure in the chamber may be between about 10 mTorr and about 760 Torr (e.g., between about 1 Torr and about 12 Torr; between about 2 Torr and about 10 Torr), during the deposition. In some implementations, the boron-containing precursor may be combined with the nitrogen-containing precursor and flowed into the interior processing volume of the process chamber at the same time at a flow rate between about 5 sccm and about 50,000 sccm, such as between 10 sccm and about 1,000 sccm for a 300 mm substrate. In some implementations, the boron-containing precursor and the nitrogen-containing precursor may be flowed into the interior processing volume of the process chamber separately. The boron nitride film may have a thickness of between about 2 Å and about 5,000 Å.

The as-deposited boron-containing film may be exposed to a post processing treatment.

Figure 3:
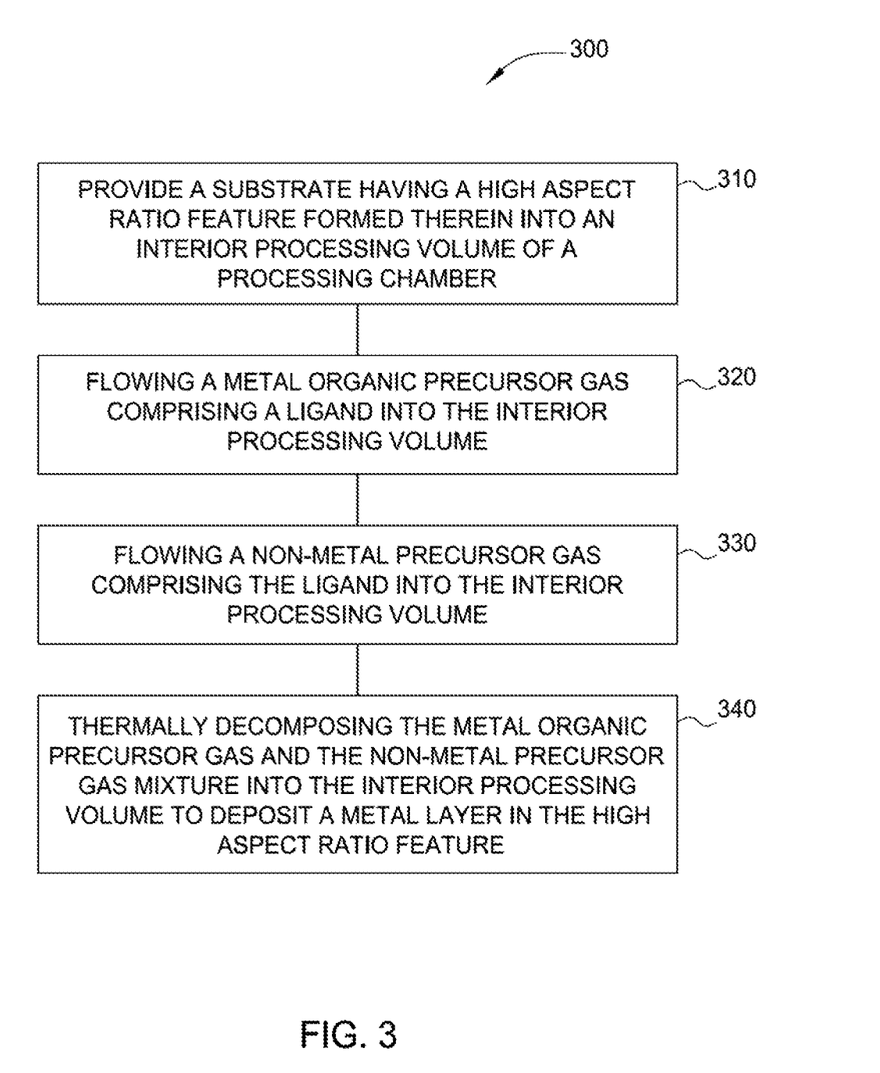
FIG. 3 is a flowchart illustrating an overview of a simplified metal-containing film deposition method according to implementations described herein.

FIG. 3 is a flowchart illustrating a simplified overview of a simplified metal-containing film deposition method 300 according to implementations described herein. At process 310 of the method 300, a substrate having a high aspect ratio feature formed therein is positioned in an interior processing volume of a process chamber similar to process 110.

At process 320 of the method 300, a metal organic precursor gas comprising a ligand is flowed into the interior processing volume of the process chamber. Exemplary metal organic compounds may include, but are not limited to metal carbonyl compounds, metal dialkylamido compounds, and/or metal cyclopentadienyl compounds. One exemplary metal organic compound containing tungsten is a tungsten carbonyl compound. Another exemplary metal organic compound is a cobalt cyclopentadienyl-containing compound.

Suitable tungsten carbonyl compounds that may be used with the implementations described herein include tungsten hexacarbonyl ($W(CO)_6$), tungsten pentacarbonyl compounds ($RW(CO)_5$), and tungsten tetracarbonyl compounds ($R_2W(CO)_4$), wherein R is one or more ligands replacing one or more carbonyl groups. In various examples, each R may be an alkylisonitrile group ($R1-N\equiv C-$) wherein each R1 is an alkyl group having from 4 to 8 carbon atoms, such as n-butyl, 1-ethylpropyl, 1,2 dimethylpropyl, isopentyl, 2-methylbutyl, 1-methylbutyl, n-pentyl, 1,3-dimethylbutyl, n-hexyl, 1-methylhexyl, and n-octyl.

Suitable cobalt-containing compounds that may be used with the implementations described herein include Bis(cyclopentadienyl)cobalt(II) ($Co(C_5H_5)_2$), Bis(ethylcyclopentadienyl)cobalt (II) ($C_{14}H_{18}Co$), Bis(penta-methylcyclopentadienyl)cobalt (II) ($C_{20}H_{30}Co$), and combinations thereof.

The metal organic precursor gas may be introduced into the chamber at a flow rate between about 5 sccm and about 50,000 sccm (e.g., between about 10 sccm and about 1,000 sccm; between about 100 sccm and about 500 sccm) for a 300 mm substrate. The metal organic precursor gas may be introduced into the interior processing volume with a dilution gas. Exemplary dilution gases include nitrogen ($N_2$), hydrogen ($H_2$), argon (Ar) or a combination thereof. Dependent upon the metal organic precursor gas used, the dilution gas may be introduced into the interior processing volume at a flow rate between about 5 sccm and about 50,000 sccm (e.g., between about 1,000 sccm and about 10,000 sccm; between about 2,000 sccm and about 7,000 sccm) for a 300 mm substrate.

At process 330 of the method 300, a non-metal precursor gas comprising the ligand is flowed into the interior processing volume of the process chamber. The ligand in the non-metal precursor gas is selected to match or substantially match the ligand present in the metal organic precursor gas. For example, in implementations where the metal organic precursor gas comprises a carbonyl ligand, the non-metal precursor gas also comprises a carbonyl ligand. In implementations where the metal organic precursor gas comprises a cyclopentadienyl ligand, the non-metal precursor gas also comprises a cyclopentadienyl ligand. Dependent upon the non-metal precursor gas used, the non-metal precursor gas may be introduced into the interior processing volume of the process chamber at a flow rate between about 5 sccm and about 50,000 sccm (e.g., between about 1,000 sccm and about 10,000 sccm; between about 2,000 sccm and about 7,000 sccm) for a 300 mm substrate. The non-metal precursor gas may be introduced into the interior processing volume of the process chamber with a dilution gas. Other gases may be used as well including gases comprising silicon-containing compounds, carbon-containing compounds, and phosphorous-containing compounds among others. In some instances, these compounds may be present while the metal organic precursor gas and the non-metal precursor gas are present in the chamber (not shown in FIG. 3). Alternatively, the compound may be introduced into the chamber before or after the introduction of the metal organic precursor gas and the non-metal precursor gas.

In some implementations, the metal organic precursor gas comprising a ligand and the non-metal ligand-containing precursor gas may be flowed into the interior processing volume simultaneously via separate gas inlets and mixed in the interior processing volume of the process chamber prior to thermal decomposition. In some implementations, the metal organic precursor gas comprising a ligand and the non-metal ligand-containing precursor gas may be mixed prior to flowing into the interior processing volume of the process chamber. The gas mixture may be introduced into the interior processing volume at a flow rate between about 5 sccm and about 50,000 sccm (e.g., between about 10 sccm and about 1,000 sccm; between about 100 sccm and about 500 sccm) for a 300 mm substrate.

At process 340, the metal organic precursor gas and the non-metal precursor gas are thermally decomposed in the interior processing volume to deposit a metal-containing layer in the high aspect ratio feature. The thermal decomposition process is performed in the absence of plasma. For deposition of the metal-containing layer, the temperature of a substrate support in the chamber may be set to between about 100 degrees Celsius and about 1,000 degrees Celsius (e.g., between about 200 degrees Celsius and about 800 degrees Celsius; between about 300 degrees Celsius and about 550 degrees Celsius) and the pressure in the chamber may be between about 10 mTorr and about 760 Torr (e.g., between about 2 Torr and about 10 Torr; between about 5 Torr and about 6 Torr) during the thermal deposition process. The as-deposited material may have a thickness between about 2 Å and about 5,000 Å.

The as-deposited material layer may be exposed to a variety of post-deposition treatment processes.

FIG. 4 is a schematic representation of a substrate processing system 432, which can be used for amorphous carbon layer deposition according to implementations described herein. Examples of suitable chamber include the CENTURA® systems which may use a DxZ™ process chamber, PRECISION 5000® systems, PRODUCER® systems, such as the PRODUCER® SE™ process chamber and the PRODUCER® GT™ process chamber, all of which are commercially available from Applied Materials, Inc., of Santa Clara, Calif. It is contemplated that the processes described herein may be performed on other substrate processing systems, including those from other manufacturers.

The substrate processing system 432 includes a process chamber 400 coupled to a gas panel 430 and a controller 410. The process chamber 400 generally includes a top 424, a side 401 and a bottom wall 422 that define an interior processing volume 426. A support pedestal 450 is provided in the interior processing volume 426 of the chamber 400. The support pedestal 450 is supported by a stem 460 and may be typically fabricated from aluminum, ceramic, and other suitable materials. The support pedestal 450 may be moved in a vertical direction inside the chamber 400 using a displacement mechanism (not shown).

The support pedestal 450 may include a heater element 470 embedded in the support pedestal 450 and suitable for controlling the temperature of a substrate 490 supported on a surface 492 of the support pedestal 450. The support pedestal 450 may be resistively heated by applying an electric current from a power supply 406 to the heater element 470. The heater element 470 may be made of a nickel-chromium wire encapsulated in a nickel-iron-chromium alloy (e.g., INCOLOY®) sheath tube. The electric current supplied from the power supply 406 is regulated by the controller 410 to control the heat generated by the heater element 470, maintaining the substrate 490 and the support pedestal 450 at a substantially constant temperature during film deposition. The supplied electric current may be adjusted to selectively control the temperature of the support pedestal 450 between about 100 degrees Celsius to about 700 degrees Celsius.

A temperature sensor 472, such as a thermocouple, may be embedded in the support pedestal 450 to monitor the temperature of the support pedestal 450 in a conventional manner. The measured temperature is used by the controller 410 to control the power supplied to the heater element 470 to maintain the substrate at a desired temperature.

A vacuum pump 402 is coupled to a port formed in the bottom of the chamber 400. The vacuum pump 402 is used to maintain a desired gas pressure in the process chamber 400. The vacuum pump 402 also evacuates post-processing gases and by-products of the process from the chamber 400.

The processing system 432 may further include additional equipment for controlling the chamber pressure, for example, valves (e.g. throttle valves and isolation valves) positioned between the process chamber 400 and the vacuum pump 402 to control the chamber pressure.

A showerhead 420 having a plurality of apertures 428 is disposed on the top of the process chamber 400 above the support pedestal 450. The apertures 428 of the showerhead 420 are utilized to introduce process gases into the chamber 400. The apertures 428 may have different sizes, number, distributions, shape, design, and diameters to facilitate the flow of the various process gases for different process requirements. The showerhead 420 is connected to the gas panel 430 that allows various gases to supply to the interior processing volume 426 during process. The precursor gases exiting the showerhead 420 thermally decompose the precursor gases resulting in the deposition of material on a surface 491 of the substrate 490.

The gas panel 430 may also be used to control and supply various vaporized liquid precursors. While not shown, liquid precursors from a liquid precursor supply may be vaporized, for example, by a liquid injection vaporizer, and delivered to the process chamber 400 in the presence of a carrier gas. The carrier gas is typically an inert gas, such as nitrogen, or a noble gas, such as argon or helium. Alternatively, the liquid precursor may be vaporized from an ampoule by a thermal and/or vacuum enhanced vaporization process.

The showerhead 420 and support pedestal 450 may form a pair of spaced apart electrodes in the interior processing volume 426. One or more RF power sources 440 provide a bias potential through a matching network 438 to the showerhead 420 to facilitate generation of plasma between the showerhead 420 and the support pedestal 450. Alternatively, the RF power sources 440 and matching network 438 may be coupled to the showerhead 420, support pedestal 450, or coupled to both the showerhead 420 and the support pedestal 450, or coupled to an antenna (not shown) disposed exterior to the process chamber 400. In one implementation, the RF power sources 440 may provide between about 100 Watts and about 3,000 Watts at a frequency of about 50 kHz to about 13.6 MHz. In another implementation, the RF power sources 440 may provide between about 500 Watts and about 1,800 Watts at a frequency of about 50 kHz to about 13.6 MHz.

The controller 410 includes a central processing unit (CPU) 412, a memory 416, and a support circuit 414 utilized to control the process sequence and regulate the gas flows from the gas panel 430. The CPU 412 may be of any form of a general purpose computer processor that may be used in an industrial setting. The software routines can be stored in the memory 416, such as random access memory, read only memory, floppy, or hard disk drive, or other form of digital storage. The support circuit 414 is conventionally coupled to the CPU 412 and may include cache, clock circuits, input/output systems, power supplies, and the like. Bi-directional communications between the controller 410 and the various components of the processing system 432 are handled through numerous signal cables collectively referred to as signal buses 418, some of which are illustrated in FIG. 4.

Other deposition chambers may also benefit from the present disclosure and the parameters listed above may vary according to the particular deposition chamber used to form the amorphous carbon layer. For example, other deposition chambers may have a larger or smaller volume, requiring gas flow rates that are larger or smaller than the gas flow rates recited for deposition chambers available from Applied Materials, Inc.

As used herein, the following terms have the meaning set forth below unless otherwise stated or clear from the context of their use.

When introducing elements of the present disclosure or exemplary aspects or implementation(s) thereof, the articles "a," "an," "the" and "said" are intended to mean that there are one or more of the elements.

The term "alkyl" embraces a linear or branched acyclic alkyl radical containing from 1 to about 15 carbon atoms. In some implementations, alkyl is a $C_{1-10}$alkyl, $C_{1-6}$alkyl or $C_{1-3}$alkyl radical. Examples of alkyl include, but are not limited to, methyl, ethyl, propyl, isopropyl, butyl, isobutyl, tert-butyl, sec-butyl, pentan-3-yl (i.e., )

and the like.

The term "carbonyl" denotes a carbon radical having two of four covalent bonds shared with a single oxygen atom (e.g., ).

The terms "comprising," "including" and "having" are intended to be inclusive and mean that there may be additional elements other than the listed elements.

The term "precursor" is used to refer to any process gas that takes part in a reaction to either remove material from or deposit material onto a surface.

The term "substrate" refers to a support substrate with or without layers formed thereon. The support substrate may be an insulator or semiconductor of a variety of doping concentrations and profiles and may, for example, be a semiconductor substrate of the type used in the manufacture of integrated circuits.

While the foregoing is directed to implementations of the present disclosure, other and further implementations of the disclosure may be devised without departing from the basic scope thereof, and the scope thereof is determined by the claims that follow.

The invention claimed is:

1. A method of processing a substrate, comprising:
flowing a boron-containing precursor comprising an amino group into an interior processing volume of a process chamber, wherein the boron-containing precursor is selected from and combinations thereof;
flowing a nitrogen-containing precursor comprising a functional group that matches the amino group into the interior processing volume, wherein the nitrogen-containing precursor is selected from the group consisting of: $HNR_2$, $NR_3$, and combinations thereof; and
thermally decomposing the boron-containing precursor and the nitrogen-containing precursor in the interior processing volume to deposit a boron nitride layer over at least one or more sidewalls and a bottom surface of a high aspect ratio feature definition formed in and below a surface of a dielectric layer on the substrate, wherein R is a lower alkyl group containing from 1 to 5 carbon atoms.

2. The method of claim 1, wherein the boron-containing precursor is selected from the group consisting of: dimethylamine borane, trimethylamine borane, triethylamine borane, and combinations thereof.

3. The method of claim 1, wherein thermally decomposing the boron-containing precursor and the nitrogen-containing precursor comprises heating the boron-containing precursor and the nitrogen-containing precursor at a temperature of about 200 degrees Celsius to about 800 degrees Celsius.

4. The method of claim 3, wherein thermally decomposing the boron-containing precursor and the nitrogen-containing precursor comprises heating the boron-containing precursor and the nitrogen-containing precursor at a temperature of about 300 degrees Celsius to about 550 degrees Celsius.

5. The method of claim 1, wherein the high aspect ratio feature definition is selected from vias, trenches, lines, contact holes, through-holes and combinations thereof.

6. The method of claim 5, wherein the high aspect ratio feature definition has a height to width ratio of at least about 5:1 or more.

7. The method of claim 1, wherein R is selected from the group of methyl, ethyl, propyl, isopropyl, butyl, isobutyl, tert-butyl, and neopentyl.

8. A method of processing a substrate, comprising:
flowing a boron-containing precursor into an interior processing volume of a process chamber, wherein the boron-containing precursor is flowing a nitrogen-containing precursor into the interior processing volume, wherein the nitrogen-containing precursor is $HNR_2$; and
thermally decomposing the boron-containing precursor and the nitrogen-containing precursor in the interior processing volume to deposit a boron nitride layer over at least one or more sidewalls and a bottom surface of a high aspect ratio feature definition formed in and below a surface of a dielectric layer on the substrate, wherein R is a lower alkyl group of 1 to 5 carbon atoms.

9. The method of claim 8, wherein the boron-containing precursor is dimethylamine borane.

10. The method of claim 8, wherein thermally decomposing the boron-containing precursor and the nitrogen-containing precursor comprises heating the boron-containing precursor and the nitrogen-containing precursor at a temperature of about 200 degrees Celsius to about 800 degrees Celsius.

11. The method of claim 10, wherein thermally decomposing the boron-containing precursor and the nitrogen-containing precursor comprises heating the boron-containing precursor and the nitrogen-containing precursor at a temperature of about 300 degrees Celsius to about 550 degrees Celsius.

12. The method of claim 8, wherein the high aspect ratio feature definition is selected from vias, trenches, lines, contact holes, through-holes and combinations thereof.

13. The method of claim 12, wherein the high aspect ratio feature definition has a height to width ratio of at least about 5:1 or more.

14. The method of claim 8, wherein R is selected from the group of methyl, ethyl, propyl, isopropyl, butyl, isobutyl, tert-butyl, and neopentyl.

15. A method of processing a substrate, comprising:
flowing a boron-containing precursor into an interior processing volume of a process chamber, wherein the boron-containing precursor is flowing a nitrogen-containing precursor into the interior processing volume, wherein the nitrogen-containing precursor is $NR_3$; and
thermally decomposing the boron-containing precursor and the nitrogen-containing precursor in the interior processing volume to deposit a boron nitride layer over at least one or more sidewalls and a bottom surface of a high aspect ratio feature definition formed in and below a surface of a dielectric layer on the substrate, wherein R is a lower alkyl group of 1 to 5 carbon atoms.

16. The method of claim 15, wherein the boron-containing precursor is selected from trimethylamine borane and triethylamine borane.

17. The method of claim 15, wherein thermally decomposing the boron-containing precursor and the nitrogen-containing precursor comprises heating the boron-containing precursor and the nitrogen-containing precursor at a temperature of about 200 degrees Celsius to about 800 degrees Celsius.

18. The method of claim 17, wherein thermally decomposing the boron-containing precursor and the nitrogen-containing precursor comprises heating the boron-containing precursor and the nitrogen-containing precursor at a temperature of about 300 degrees Celsius to about 550 degrees Celsius.

19. The method of claim 15, wherein the high aspect ratio feature definition is selected from vias, trenches, lines, contact holes, through-holes and combinations thereof and has a height to width ratio of at least about 5:1 or more.

20. The method of claim 15, wherein R is selected from the group of methyl, ethyl, propyl, isopropyl, butyl, isobutyl, tert-butyl, and neopentyl.

* * * * *